US006429036B1

(12) United States Patent
Nixon et al.

(10) Patent No.: US 6,429,036 B1
(45) Date of Patent: Aug. 6, 2002

(54) BACKSIDE ILLUMINATION OF CMOS IMAGE SENSOR

(75) Inventors: Robert Nixon, Pasadena; Nicholas Doudoumopoulos, Marin del Rey; Eric R. Fossum, La Crescenta, all of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/483,362

(22) Filed: Jan. 14, 2000

Related U.S. Application Data
(60) Provisional application No. 60/116,144, filed on Jan. 14, 1999.

(51) Int. Cl.[7] .............................................. H01L 21/00
(52) U.S. Cl. ........................ 438/57; 438/458; 438/460
(58) Field of Search ................................ 438/108, 125, 438/455, 408, 66, 67, 459, 460, 57, 60

(56) References Cited

U.S. PATENT DOCUMENTS 5,753,537 A  *  5/1988  Dekker et al. .............. 438/113

* cited by examiner

*Primary Examiner*—John F. Niebling
*Assistant Examiner*—Christopher Lattin
(74) *Attorney, Agent, or Firm*—Fish & Richardson P.C.

(57) ABSTRACT

A CMOS image sensor die is fabricated and packaged to allow the light sensitive area of the die to be illuminated from either the front side or the backside, or both. The implementation is achieved using wafer level processing that facilitates photon collection at both surfaces. This approach permits processing apt the wafer level to allow the deposition of color filter arrays (CFA) on either surface. The silicon is thinned and the bump contacts and interconnect lines are relocated away from the image area of the die. The die is covered with an optically transparent material to provide additional support.

11 Claims, 3 Drawing Sheets

BACKSIDE ILLUMINATION OF CMOS IMAGE SENSOR

TECHNICAL FIELD

This application claims benefit of U.S. Provisional a application No. 60/116,144, filed Jan. 14, 1999.

This invention relates to image sensors, and more particularly to the manufacturing of CMOS image sensors capable of backside illumination.

BACKGROUND

Typically, a CMOS image sensor is illuminated from the front (or top) side of the silicon die. Because of processing features (metalization, polysilicon, diffusions, etc.), the pixel area is partially obscured, resulting in a loss of photons reaching the sensitive area and a reduction in the area in which photons are effectively collected. This results .in a reduction of the overall sensitivity of the sensor. If photons were collected from the backside of the pixel area, these obstacles could be overcome., However, backside illumination can be difficult because of the thickness of the bulk silicon and the packaging technology that allow the backside to be exposed to the illumination source. The thickness of a typical silicon wafer needs to be thinned considerably in order to absorb the photons in the sensitive area. Prior approaches utilized methods for thinning the die after they have been scribed from a wafer and then packaging the die in specialized packages. The specialized packages provide support to the thin die while providing unobstructed ports for illumination from the backside. However, this approach is both costly and time consuming.

SUMMARY

A CMOS image sensor is fabricated and packaged to allow the light sensitive area of the die to be illuminated from either the front side or the back side, or both. The implementation is achieved using wafer level processing that facilitates photon collection at both surfaces. This approach permits processing at the wafer level to allow the deposition of color filter arrays (CFA) on either surface. The silicon is thinned and the bump contacts and interconnect lines are relocated away from the image area of the die. The die is covered with an optically transparent material to provide additional support.

DESCRIPTION OF DRAWINGS

These and other features and advantages of the invention will become more apparent upon reading the following detailed description and upon reference to the accompanying drawings.

DETAILED DESCRIPTION

Figure 1:
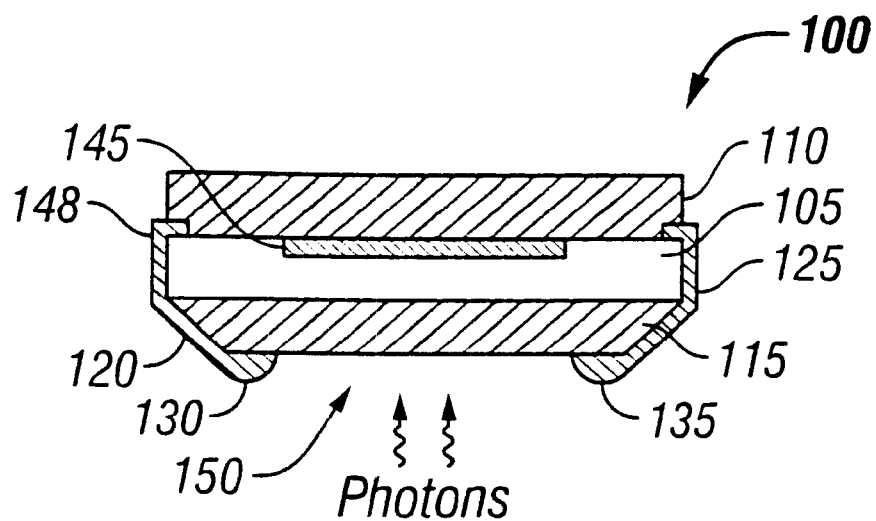
FIG. 1 illustrates an image sensor according to the present invention.

A CMOS image sensor 100 according to the present invention is illustrated in FIG. 1. The image sensor 100 is packaged at the wafer level using semiconductor manufacturing processes. The image sensor includes a thin silicon substrate 105 which is sandwiched between two thin protective plates 110, 115 on the top and bottom sides. An epoxy adhesive layer (not shown) attaches the protective plates 110, 115 to the silicon substrate 105 and surrounds and protects the edges of the silicon 105. Electrical leads 120, 125 connect to pads 130, 135 of the sensor die by a non-bonding technique. Pixels 145 are positioned at the top surface 148 of the silicon substrate 105. The image sensor 100 is light sensitive along a back side 150.

The image sensor 100 of the present invention may be contained in either perimeter or area array leaded configurations. The solderable leads have pitches down to 0.5 mm in the peripheral configuration and 0.8 mm in the area array configuration.

Figure 2:
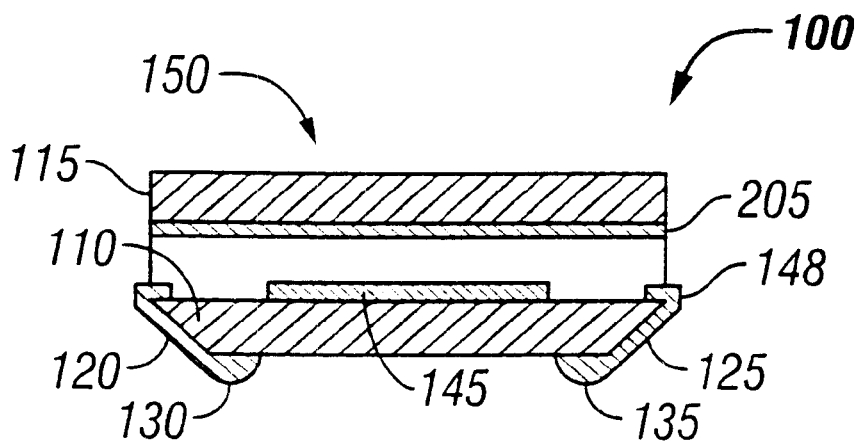
FIG. 2 illustrates an image sensor including a color filter array according to the present invention.

FIG. 2 illustrates the image sensor 100 of FIG. 1 modified to include a color filter array (CFA) 205. The CFA 205 allows the image sensor 100 to achieve color imaging. The CFA 205 is deposited on the bottom protective plate 115 of the image sensor 100. When a CFA 205 is used, the electrical leads 120, 125 and pads 130, 135 are moved to the top surface 148 of the image sensor 100.

Figure 3:
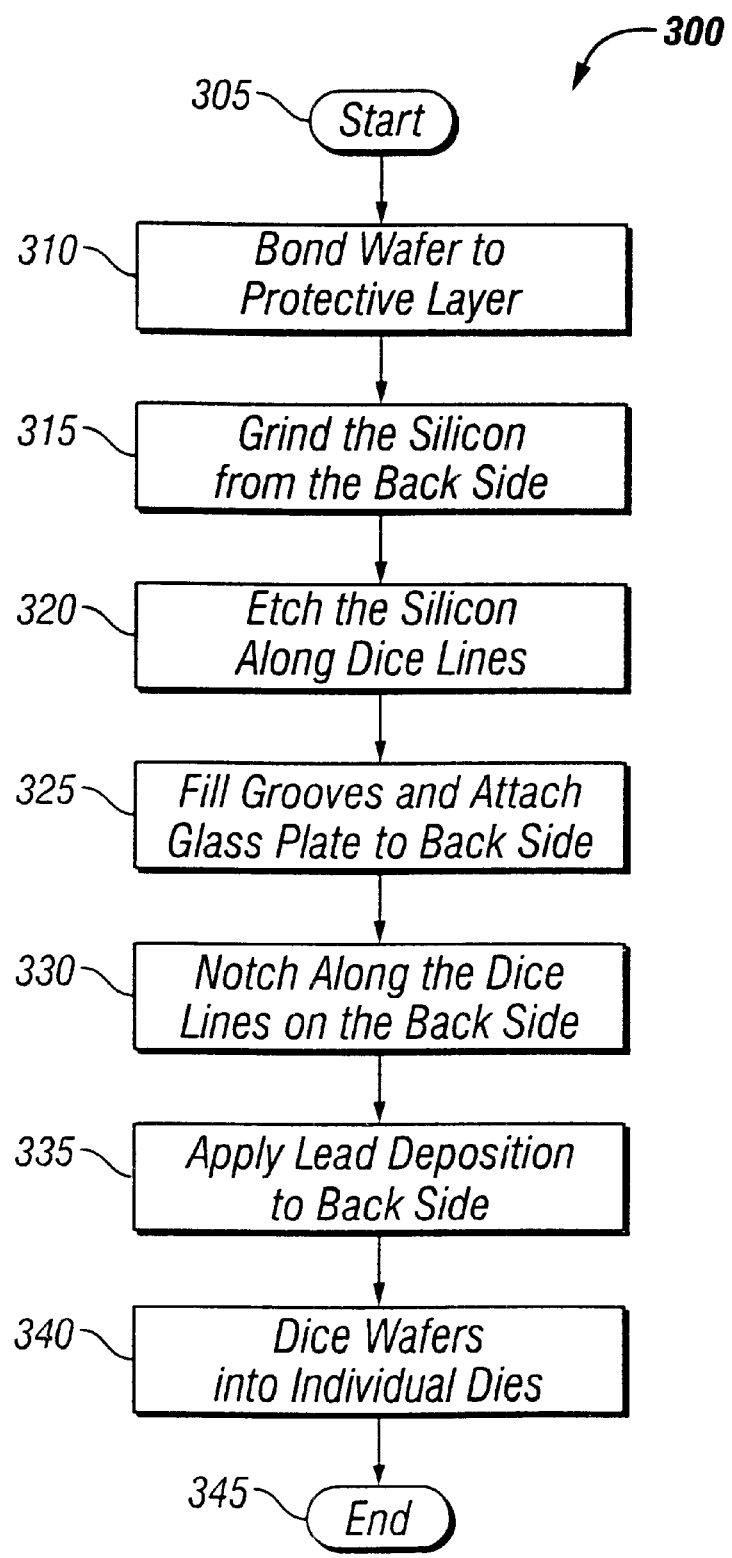
FIG. 3 is a flowchart illustrating the process to form an image sensor according to the present invention.
Figure 4A:
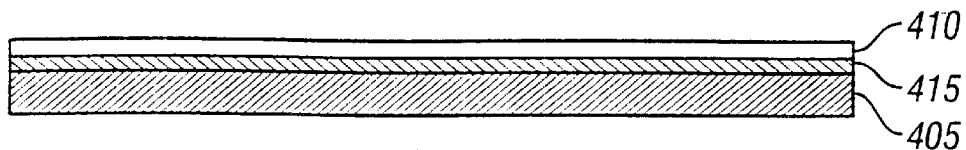
FIGS. 4A–4G illustrates the image sensor in various stages of formation according to the process of FIG. 3.
Figure 4B:
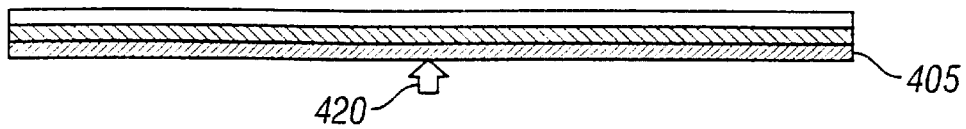

The process 300 for manufacturing image sensors 100 according to the present invention is illustrated in FIG. 3, with the image sensors 100 at each stage of the process being shown in FIGS. 4A–4G. The process begins at a start state 305. Proceeding to state 310, a silicon wafer 405 is bonded onto a thin protective layer, or first glass plate 410 as seen in FIG. 4A. The first glass plate 410 is bonded while the active surface of the silicon wafer is facing up into the encapsulate. The first glass plate 410 may be coated with a filter layer 415 as will be discussed below. If a filter layer 415 is used, the glass plate 410 is bonded to the silicon wafer 405 such that the side of the glass plate 410 containing the filter layer 415 faces the active surface of the silicon wafer 405.

Proceeding to state 315, if the silicon wafer 405 is thicker than desired, the silicon wafer 405 is ground to a predetermined thickness. In one embodiment of the invention, the silicon wafer 405 is ground to a thickness of approximately 70 microns. The silicon wafer 405 is ground from the back side of the wafer as shown by the arrow 420 in FIG. 4B.

Figure 4C:
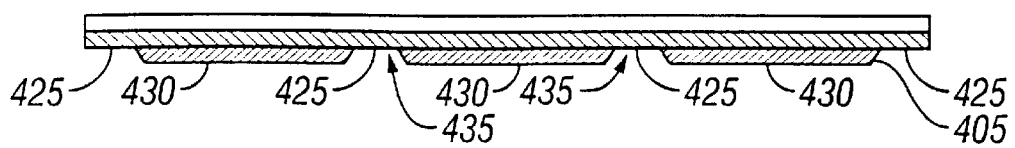

Proceeding to state 320, the silicon wafer 405 is now etched along the dice lines 425 as seen in FIG. 4C. By etching the silicon wafer 405, the wafer is separated into individual dies 430 as seen in FIG. 4C. Of course, the desired size of each individual dies 430 determines the number of dies produced from each silicon wafer 405.

Figure 4D:
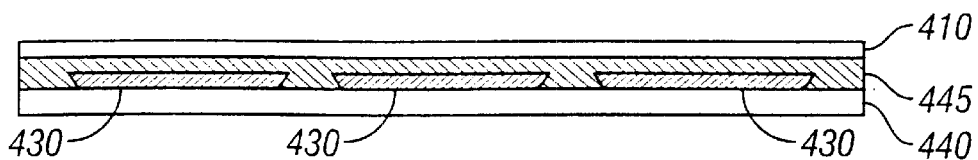

Proceeding to state 325, the grooves 435 between the individual dies 430 are filled and a second glass plate 440 is bonded onto the back side of the silicon dies as seen in FIG. 4D. The grooves are filled with an inertmaterial 445. The second glass plate 440 when combined with the first glass plate 410 creates a complete protective enclosure for each die 430. Epoxy may be used to bond the second glass plate 440 to the silicon dies 430, and the epoxy may fill the grooves 435 between the dies 430.

Figure 4E:
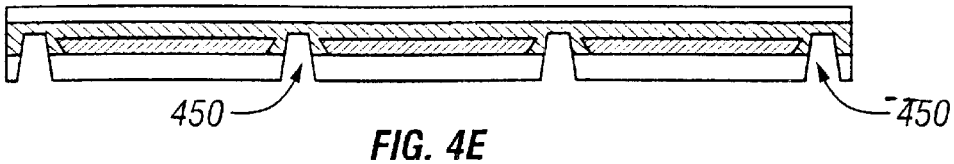

Proceeding to state 330, deep notches 450 are drawn between the dies 430 as shown in FIG. 4E. By drawing deep notches 450 between the dies 430, the cross sections of each Of the pads are exposed.

Figure 4F:
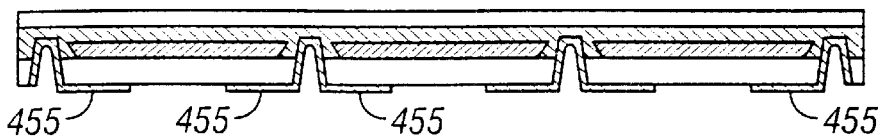

Proceeding to state 335, a metal layer is deposited to contact each pad at its cross section as seen in FIG. 4F. The metal layer is patterned by a lithography process into individual leads 455 that contact the pads and form a soldering pad on the upper surface of each die package. Contacts may then be plated by either gold or lead-tin.

Figure 4G:
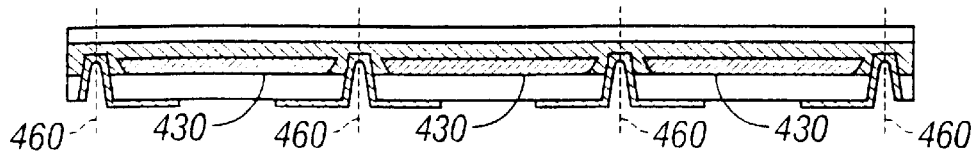

Proceeding to state 340, the wafer is diced into individual packaged dies. The wafer is diced along score lines 460 within the notches 450 between the dies 430. The multiple individual packaged dies 430 that comprise the wafer are shown in FIG. 4G. The process 300 then terminates in end state 340.

The image sensor packages assembled according to the present invention allows for the light sensitive area of the die 430 to be illuminated from either the front side or the back side, or both. The package also provides a true die size package with an extremely low thickness, typically in the range of approximately 0.6 mm to approximately 2.0 mm. Even at these thicknesses, the package offers a complete mechanical enclosure for the die and does not leave any silicon exposed to the outside. This provides both mechanical and environmental protection. The manufacturing process also results in lower cost, particularly for smaller dies.

Testing has shown image sensors according to the present invention have dimensional and assembly tolerances that are more sensitive than ordinary integrated circuit packaging. Table 1 compares the mechanical accuracies between an image sensor according to the present invention and two regular, mechanically assembled optical packages (packages A and B).

| Mechanical Feature | Package A | Package B | Present Invention |
|---|---|---|---|
| Center Translation of effective image area (X,Y) | ±150μ | ±85μ | ±35μ |
| Rotation angle of effective image area (in focal plane) | <±1 | <±0.25 | <±0.01 |
| Tilt of effective image area (z-axis) | <60μ | <±25μ | <10μ |
| Thickness of cover glass | 0.75 mm | 0.55 mm | >0.4 to 1 mm |
| Self Centering | No | No | Yes |

As shown in Table 1, another advantage of the present invention is a "self-centering" phenomenon that occurs during solder reflow. When the image sensor 100 is placed on a pad with solder paste, exact placement is not required. The surface tension of the molten solder drives the image sensor to align itself to the exact placement in relation to the pads and trace patterns on the board. In addition to alignment in the lateral direction, there is also vertical alignment. The vertical alignment compensates for some of the warpage and irregularities that may be seen in the board, thereby improving and simplifying the accurate assemble of the image sensor.

As described above, a color filter array (CFA) 205 may be added to the image sensor 100 of the present invention. The CFA 205 may be, for example, a coated filter for infra-red (IR) blocking or an absorption filter for IR blocking. The IR blocking filters compensates for the different spectral response of the silicon detector and the human retina. The silicon detects ultra violet and infra-red in ranges beyond the visual range. However, the spectral response in the visible spectra is different for the eye and the silicon detector.

The CFAs 205 correct the silicon detection response to match the eye response. These filters are commercially available and are known in the art. The filters may be of an interference type, a thin film type, or an absorption type. By integrating the CFA 205 into the package, the filter plate area is minimized. This results in lower costs and reduction of the filter size required.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of manufacturing an image sensor comprising:
   attaching a first cover layer to an active surface of a silicon wafer;
   attaching a second cover layer to an opposite surface of the silicon wafer;
   notching the silicon wafer along the second cover layer; and
   forming electrical interconnections on the notched surface of the silicon wafer;
   wherein the image sensor is light sensitive from a back side.

2. The method of claim 1, wherein the electrical interconnections comprise bump contacts.

3. The method of claim 1, wherein the electrical interconnections comprise interconnect lines.

4. The method of claim 1, wherein the electrical interconnections are formed away from the active surface of the silicon wafer.

5. The method of claim 1, further comprising the steps of:
   grinding the silicon wafer from the opposite surface of the silicon wafer; and
   dicing the wafer into individual dies.

6. The method of claim 5, wherein the individual dies have a thickness in the range of approximately 0.6 mm to approximately 2.0 mm.

7. The method of claim 1, further comprising coating the second glass surface with a color filter layer.

8. The method of claim 7, wherein the filter layer is a color filter array.

9. The method of claim 8, wherein the electrical interconnections are formed on the first glass surface.

10. The method of claim 1, wherein the image sensor is light sensitive from a front side.

11. The method of claim 1, wherein the electrical interconnections are located outside an image area.

* * * * *

UNITED STATES PATENT AND TRADEMARK OFFICE
CERTIFICATE OF CORRECTION

PATENT NO. : 6,429,036 B1
DATED : August 6, 2002
INVENTOR(S) : Robert Nixon, Nicholas A. Doudoumopoulos and Eric R. Fossum, Ph.D.

It is certified that error appears in the above-identified patent and that said Letters Patent is hereby corrected as shown below:

<u>Title page,</u>
Item [75], Inventors, "Eric Doudoumopoulos" city and state, replace "Marin del Rey" with -- Marina del Rey --.
Item [57], ABSTRACT,
Line 6, replace "apt" with -- at --.

Signed and Sealed this

Twenty-sixth Day of November, 2002

Attest:

JAMES E. ROGAN
Attesting Officer   Director of the United States Patent and Trademark Office